(12) United States Patent
Feldman et al.

(10) Patent No.: US 11,787,305 B2
(45) Date of Patent: Oct. 17, 2023

(54) ESTIMATING VEHICLE STATE OF CHARGE USING BLUETOOTH IDENTIFICATION

(71) Applicant: ENEL X S.R.L., Rome (IT)

(72) Inventors: Daniel Feldman, San Jose, CA (US); Amanpreet Kaur, San Francisco, CA (US)

(73) Assignee: Enel X Way S.R.L., Rome (IT)

( * ) Notice: Subject to any disclaimer, the term of this patent is extended or adjusted under 35 U.S.C. 154(b) by 380 days.

(21) Appl. No.: 16/999,873

(22) Filed: Aug. 21, 2020

(65) Prior Publication Data

US 2022/0055500 A1 Feb. 24, 2022

(51) Int. Cl.
*B60L 58/12* (2019.01)
*G01R 31/382* (2019.01)
(Continued)

(52) U.S. Cl.
CPC ............. *B60L 58/12* (2019.02); *B60L 53/305* (2019.02); *G01C 21/3407* (2013.01); *G01C 21/3679* (2013.01); *G01C 22/00* (2013.01); *G01R 31/367* (2019.01); *G01R 31/382* (2019.01); *G01S 19/42* (2013.01); *B60L 2240/54* (2013.01)

(58) Field of Classification Search
CPC .. B60L 58/12; B60L 2260/52; B60L 2260/54; B60L 53/62; B60L 53/66; B60L 53/305; B60L 50/60; Y02T 90/12; Y02T 10/72; Y02T 10/7072; Y02T 10/70;
(Continued)

(56) References Cited

U.S. PATENT DOCUMENTS 7,647,165 B2 1/2010 Godfrey et al.
2011/0010300 A1* 1/2011 Audet .................. G06Q 30/06
705/307
(Continued)

FOREIGN PATENT DOCUMENTS

EP 3498520 6/2019
JP 2013215084 10/2013
WO 2015120318 8/2015

OTHER PUBLICATIONS

International Search Report and Written Opinion dated Dec. 9, 2021 for international application PCT/US2021/046783.

*Primary Examiner* — Richard Isla
*Assistant Examiner* — Johali A Torres Ruiz
(74) *Attorney, Agent, or Firm* — Foley & Lardner LLP

(57) ABSTRACT

Techniques for estimating a vehicle state of charge ("SoC") are disclosed. A computing device may determine a first instance of connectivity between the computing device and an electric vehicle and determine a first location of the computing device associated with the first instance of connectivity. The computing device may detect completion of a first trip of the electric vehicle, wherein the first trip reflects movement of the electric vehicle from the first location to a second location, and determine a first distance traveled by the electric vehicle during the first trip based on the first location and the second location. The computing device may select the electric vehicle for charging using the determined first instance of connectivity between the computing device and the electric vehicle, estimate a SoC of the selected electric vehicle using the determined first distance, and transmit the estimated SoC to a charging station.

7 Claims, 5 Drawing Sheets

(51) Int. Cl.
*G01R 31/367* (2019.01)
*G01C 22/00* (2006.01)
*G01S 19/42* (2010.01)
*G01C 21/34* (2006.01)
*G01C 21/36* (2006.01)
*B60L 53/30* (2019.01)

(58) Field of Classification Search
CPC ..... G01S 19/42; G01R 31/382; G01R 31/367; G01C 22/00
See application file for complete search history.

(56) References Cited

U.S. PATENT DOCUMENTS

| | | |
|---|---|---|
| 2013/0179057 A1 | 7/2013 | Fisher et al. |
| 2015/0214761 A1* | 7/2015 | Kono .................. B60L 15/2045 320/128 |
| 2021/0083497 A1* | 3/2021 | Fujita ....................... B60L 53/80 |
| 2021/0284104 A1* | 9/2021 | Olson .............. G06Q 20/40155 |
| 2021/0316635 A1* | 10/2021 | Books Martin ....... B60L 3/0046 |

* cited by examiner

ESTIMATING VEHICLE STATE OF CHARGE USING BLUETOOTH IDENTIFICATION

TECHNICAL FIELD

The present disclosure generally relates to the field of estimating vehicle state of charge ("SoC"). More particularly, techniques for estimating electric vehicle battery SoC using Bluetooth identification are disclosed.

BRIEF DESCRIPTION OF THE DRAWINGS

The present embodiments will become more fully apparent from the following description, taken in conjunction with the accompanying drawings. Understanding that the accompanying drawings depict only typical embodiments, and are, therefore, not to be considered limiting of the scope of the disclosure, the embodiments will be described and explained with specificity and detail in reference to the accompanying drawings.

DETAILED DESCRIPTION

Figure 1:
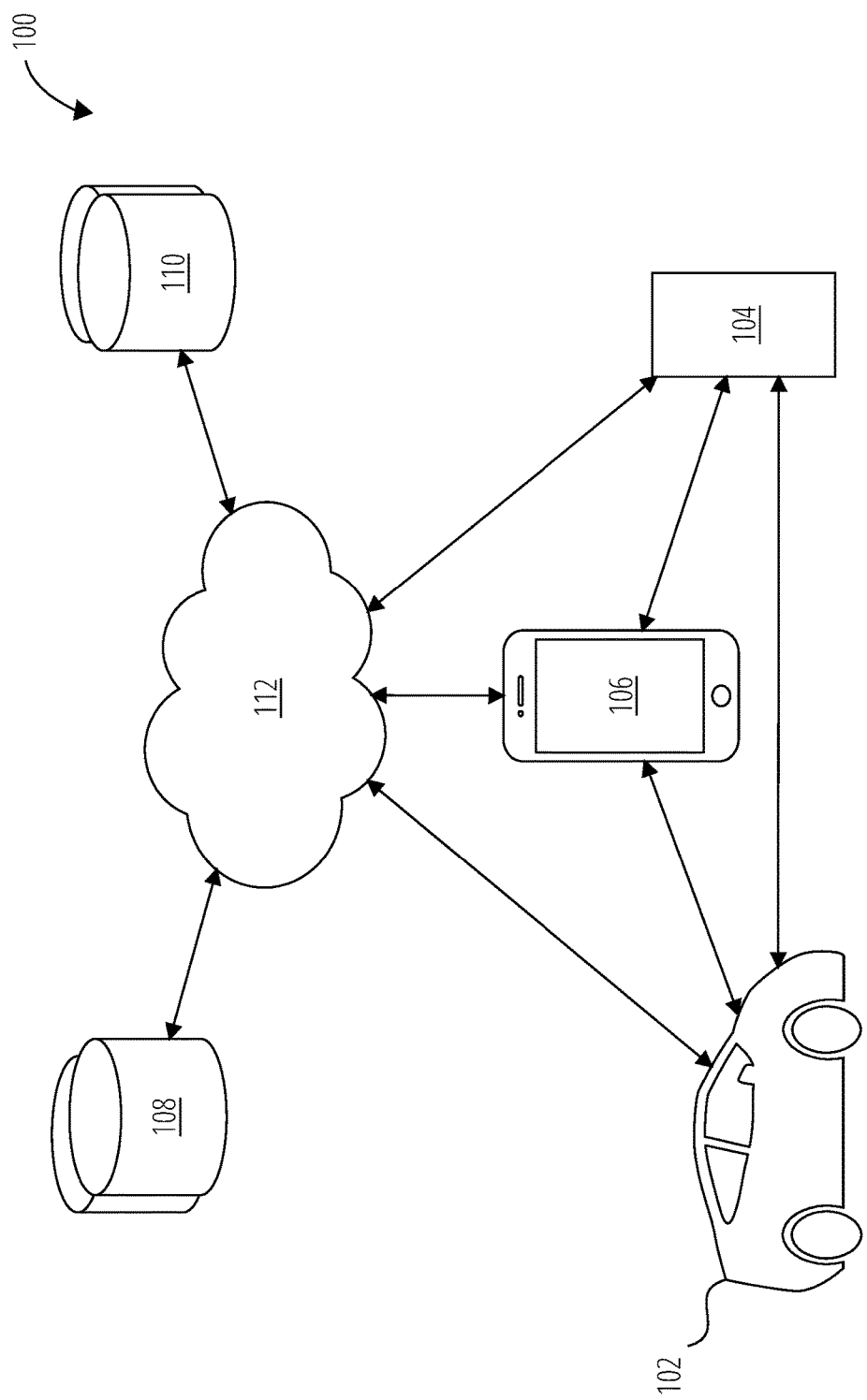
FIG. 1 shows a system for estimating vehicle SoC, according to some embodiments.

It will be readily understood that the components of the embodiments as generally described and illustrated in the figures herein could be arranged and designed in a wide variety of different configurations. Thus, the following more detailed description of various embodiments, as represented in the figures, is not intended to limit the scope of the disclosure, as claimed, but is merely representative of various embodiments. While the various aspects of the embodiments are presented in drawings, the drawings are not necessarily drawn to scale unless specifically indicated.

Moreover, the phrases "connected to" and "coupled to" are used herein in their ordinary sense, and are broad enough to refer to any suitable coupling or other form of interaction between two or more entities, including mechanical, fluid, and thermal interaction. Two components may be coupled to each other even though they are not in direct contact with each other. The phrase "attached to" refers to interaction between two or more entities which are in direct contact with each other and/or are separated from each other only by a fastener of any suitable variety (e.g., an adhesive, etc.).

The terms "a" and "an" can be described as one, but not limited to one. For example, although the disclosure may recite an element having, e.g., "a line of stitches," the disclosure also contemplates that the element can have two or more lines of stitches.

Unless otherwise stated, all ranges include both endpoints and all numbers between the endpoints.

Reference throughout this specification to "an embodiment" or "the embodiment" means that a particular feature, structure, or characteristic described in connection with that embodiment is included in at least one embodiment. Thus, the quoted phrases, or variations thereof, as recited throughout this specification are not necessarily all referring to the same embodiment. Not every embodiment is shown in the accompanying illustrations; however, at least a preferred embodiment is shown. At least some of the features described for a shown preferred embodiment are present in other embodiments.

The term electric vehicle ("EV"), as used herein, refers to a motorized vehicle deriving locomotive power, either full-time or part-time, from an electric system on board the motorized vehicle. By way of non-limiting examples, an EV may be an electrically powered passenger vehicle for road use; an electric scooter; an electric fork lift; a cargo-carrying vehicle powered, full-time or part-time, by electricity; an off-road electrically powered vehicle; an electrically powered watercraft; etc.

The term electric vehicle supply equipment ("EVSE"), as used herein, refers to equipment by which an EV may be charged or recharged. An EVSE may comprise or be coupled to a computing system whereby service to the EV is provisioned, optionally, according to operator-selectable parameters. An EVSE may comprise a means of providing cost accounting, and may further comprise a payment acceptance component. An EVSE may be installed at a home of an owner/operator of an EV, at a place of business for an owner/operator of an EV, at a fleet facility for a fleet comprising one or more EVs, at a public charging station, etc. The present disclosure uses the terms EVSE and "charging station," where for purposes of this disclosure, an EVSE is an example of a charging station.

According to some embodiments, techniques that estimate parameters relating to EV charging using location information obtained from a user's computing device (e.g., cell phone, tablet, mobile device, etc.) are disclosed. Determining how far an EV travels between charging sessions can be problematic. According to some embodiments, an estimation of the distance an EV travels between charging sessions is determined, which, among other things, may provide a basis for estimating the SoC for the EV, determining when to limit charging of the EV (e.g., when the EV is approaching full charge or a desired charge level that is less than full charge), and/or determining how to allocate power to the EV during multiple vehicle charging.

For example, a user may drive an EV to a charging station (e.g., at home or at a public location, such as a shopping mall or business) and direct charging of the EV using a computing device (e.g., a driver's or vehicle occupant's cell phone) storing the EV's Bluetooth media access control ("MAC") address. Embodiments of the present disclosure include computer software that associates this MAC address of the EV with a profile of the EV stored in a database. The software may recognize that the computing device stores the EV MAC address and automatically selects the EV as the vehicle that was driven to the charging station and is to be charged. This recognition and automatic selection may occur because an EV MAC address is stored on a computing device when the device is connected to an EV via Bluetooth for hands-free functionality such as music playback or the like. Thus, it may be likely that when a MAC address corresponding to an EV is stored on the computing device directing charging, the vehicle to be charged corresponds to the stored MAC address. In some embodiments, the vehicle selection is automatic (as discussed above). In other embodiments, the vehicle selection is semi-automatic, where, for example, when the user has previously indicated that a different vehicle is subject to charging functions, the user is asked (e.g., via an application on the computer device) whether the user is instead driving the vehicle recognized using the stored MAC address.

In some embodiments, location information of the phone is accessed. For example, one or more "trips," identified by instances since a vehicle's last charge where the selected vehicle and the computing device were connected to each other (e.g., via Bluetooth), are determined, where the estimated distance traveled during each trip may be further determined. In some embodiments, each trip may be defined by determining a location of the computing device when it was initially connected to the selected EV and stored the EV's MAC address (e.g., when Bluetooth connection is used), determining a trip end location (e.g., a current location at the end of a trip), and determining a difference between the trip end location and the location where the initial connectivity took place. Miles driven by the EV during the trip may be estimated using the determined difference. The total estimated distance traveled during all of the one or more trips between charging sessions may be determined and used to estimate the distance driven by the vehicle since the last charge. The EV's SoC may be determined at the end of each trip.

In some embodiments, the EV's SoC is estimated using the estimated distance driven since the last charge. In some embodiments, in addition or alternatively to the estimated distance driven since the last charge, one or more of an estimated SoC at the end of the EV's previous trip and vehicle characteristics (e.g., mileage per kWh, battery size) may be used to estimate the EV's SoC. The vehicle characteristics may be selected by a user to specify a certain vehicle configuration. The vehicle characteristics may be obtained from a third-party (e.g., a database of the EV manufacturer).

By estimating vehicle SoC, allocation of power between multiple vehicles being charged by the same power source can be improved. Moreover, a user may be provided with an improved indication of vehicle travel range and may make a more informed and improved selection of charging limits during charging. For example, the user can select a charging limit that is a certain percentage of total battery capacity.

FIG. 1 shows a system 100 for estimating vehicle SoC according to some embodiments of the present disclosure. In some embodiments, system 100 includes a vehicle 102 and a charging station 104. For example, the vehicle 102 may be an EV discussed above and/or the charging station 104 may be an EVSE discussed above. The vehicle 102 may be charged using the charging station 104, where electricity may be provided from the charging station 104 to a battery of the vehicle 102.

In some embodiments, the system 100 includes a computing device 106. For example, the computing device 106 may be a cellular phone, tablet computer, laptop computer, or the like. In some embodiments, the computing device 106 includes global positioning system ("GPS") circuitry configured to determine a current location of the computing device 106. In some embodiments, the computing device includes circuitry configured to determine a current location of the computing device 106 using triangulation based on two or more wireless communication network access points for which respective locations are known. For example, each of the two or more wireless communication network access points may be a WIFI access point. In another example, each of the two or more wireless communication network access points may be a node of a mobile communication network (e.g., a cellular network such as GSM, LTE, 5G, or the like).

In some embodiments, the computing device 106 is a computing device of a driver, occupant, or individual otherwise associated with the vehicle 102. In some embodiments, the computing device 106 is in wireless or wired communication with the vehicle 102. For example, the vehicle 102 may include short range communication (e.g., Bluetooth) functionality where, for example, an onboard computing device of the vehicle 102 may transmit data to and/or receive data from one or more of the computing devices 106 (e.g., via Bluetooth) located within a communication range of the vehicle 102. Similarly, the charging station 104 and/or the computing device 106 may also include short range communication (e.g., Bluetooth) functionality and may each transmit data to and/or receive data from other computing devices (e.g., via Bluetooth) located within a communication range of the charging station 104 and/or the computing device 106, respectively. Each of the vehicle 102, charging station 104, and computing device 106 may further each use a network 112 for communication, as discussed below. In some embodiments, the computing device 106 is configured to control charging of the vehicle 102 by the charging station 104 and/or determine an estimated SoC of the vehicle 102.

In some embodiments, the system 100 includes one or more databases 108. For example, a database 108 may store data from or used by one or more of the vehicle 102, the charging station 104, the computing device 106, and/or the computing device 110 (discussed below). The data may be profile data for a vehicle driver reflecting information (e.g., make, model, VIN, Bluetooth MAC address, etc.) about one or more of the vehicle 102 operated by, owned by, or otherwise associated with the driver.

In some embodiments, system 100 includes one or more other computing devices 110. For example, a computing device 110 may be a remote computing device (e.g., a cloud computer or the like) that communicates with one or more of the vehicle 102, the charging station 104, the computing device 106, and/or the database 108 directly or via the network 112. In some embodiments, the computing device 110 determines whether a particular user (e.g., vehicle driver, occupant, or person associated with the vehicle) is authorized to charge or have vehicle 102 charged at a particular charging station 104. For example, the computing device 110 may process data (e.g., identification data, security token data, etc.) from the vehicle 102, the charging station 104, the computing device 106, and/or the database 108 to determine whether a user is authorized to charge or have the vehicle 102 charged by the charging station 104. In some embodiments, the computing device 110 is configured to control charging of the vehicle 102 and/or determine an estimated SoC of the vehicle 102. For example, the computing device 110 may receive one or more of location data, SoC data, vehicle characteristics, and the like from the vehicle 102, the charging station 104, the computing device 106, and/or the database 108, and may determine a vehicle 102 SoC for use by charging station 104 when charging the vehicle 102.

In some embodiments, the system 100 includes a network 112. For example, the network 112 may be a cellular network, the Internet, a wide area network ("WAN"), a local area network ("LAN"), or any other type of communications network. In some embodiments, one or more of the vehicle 102, the charging station 104, the computing device 106, the database 108, and/or the computing device 110 use the network 112 to communicate with each other and/or other computing devices. In some embodiments, each of the devices/elements of the system 100 includes a network interface that allows for communication within the system 100 via the network 112.

In some embodiments, the computing device 106 communicates with the vehicle 102 and the charging station 104 directly (e.g., via Bluetooth or a different short range communication protocol) or indirectly via the network 112. In some embodiments, in addition or alternatively, the vehicle 102 and the charging station 104 communicate with each other directly (e.g., via Bluetooth or a different short range communication protocol) or indirectly via the network 112.

In some embodiments, the system 100 is used to control charging of the vehicle 102 and/or estimate an SoC for the vehicle 102. For example, the charging control and/or SoC estimation may be performed by the computing device 106 and/or the computing device 110.

In some embodiments, the computing device 106 may store a software application that facilitates estimating the SoC for the vehicle 102 and/or controlling charging of the vehicle 102. In some embodiments, the computing device 106 may store location data and/or other data relevant to estimating the SoC of the vehicle 102. In some embodiments, the computing device 106 may receive location data and/or other data relevant to estimating the SoC of the vehicle 102 from one or more of the vehicle 102, the charging station 104, the database 108, and/or the computing device 110. Alone or in combination with one or more of the vehicle 102, the charging station 104, the database 108, and/or the computing device 110, the computing device 106 may determine an estimated SoC for the vehicle 102. The computing device 106 may then directly transmit the estimated SoC to the charging station 104 and/or transmit the estimated SoC to the charging station 104 via the network 112. In some embodiments, the computing device 106 controls the overall charging of the vehicle 102 alone or in combination with the vehicle 102, the charging station 104, the database 108 and/or the computing device 110. Here, for example, the computing device 106 may control the charging rate, amount, and/or duration of charging of the vehicle 102 by the charging station 104.

In some embodiments, the charging control and/or SoC estimation for the vehicle 102 is performed by the computing device 110. For example, the computing device 110 is remotely located from one or more of the vehicle 102, the charging station 104, and/or the computing device 106. In some embodiments, the computing device 110 stores software that estimates the SoC of the vehicle 102. In some embodiments, the location data and/or other data relevant to estimating the SoC of the vehicle 102 stored by the computing device 106 may be transmitted to and/or received by the computing device 110. In some embodiments, location data and/or other data relevant to estimating the SoC of the vehicle 102 may be received by the computing device 110 from one or more of the vehicle 102, the charging station 104, the computing device 106, and/or the database 108. The computing device 110 may estimate the SoC of the vehicle 102 using the received information and transmit the estimate to one or more of the vehicle 102, the charging station 104, the computing device 106, and/or the database 108. In some embodiments, the computing device 106 may execute a software application to communicate with the computing device 110 and/or facilitate the computing device 110 in determining the SoC of the vehicle 102. In some embodiments, the computing device 110 controls the overall charging of the vehicle 102 alone or in combination with the vehicle 102, the charging station 104, the database 108 and/or the computing device 110. Here, for example, the computing device 110 may control the charging rate, amount, and/or duration of charging of the vehicle 102 by the charging station 104.

In some embodiments, the computing device 110 receives a current location of the computing device 106, and receives a confirmation of connectivity between the computing device 106 and the vehicle 102. In some embodiments, the computing device 110 determines when the vehicle 102 is collocated with a charging station 104 based on a match of the current location of the computing device 106 to a known location of the charging station 104 or the current location of the computing device 106 being within a predetermined distance (e.g., 10 feet, 50 feet, 100 feet, etc.) of the known location of the charging station 104. In some embodiments, the computing device instructs or authorizes the collocated charging station 104 to charge the vehicle 102 (e.g., upon connection of the vehicle 102 to the collocated charging station 104) according to the estimated SoC.

Figure 2:
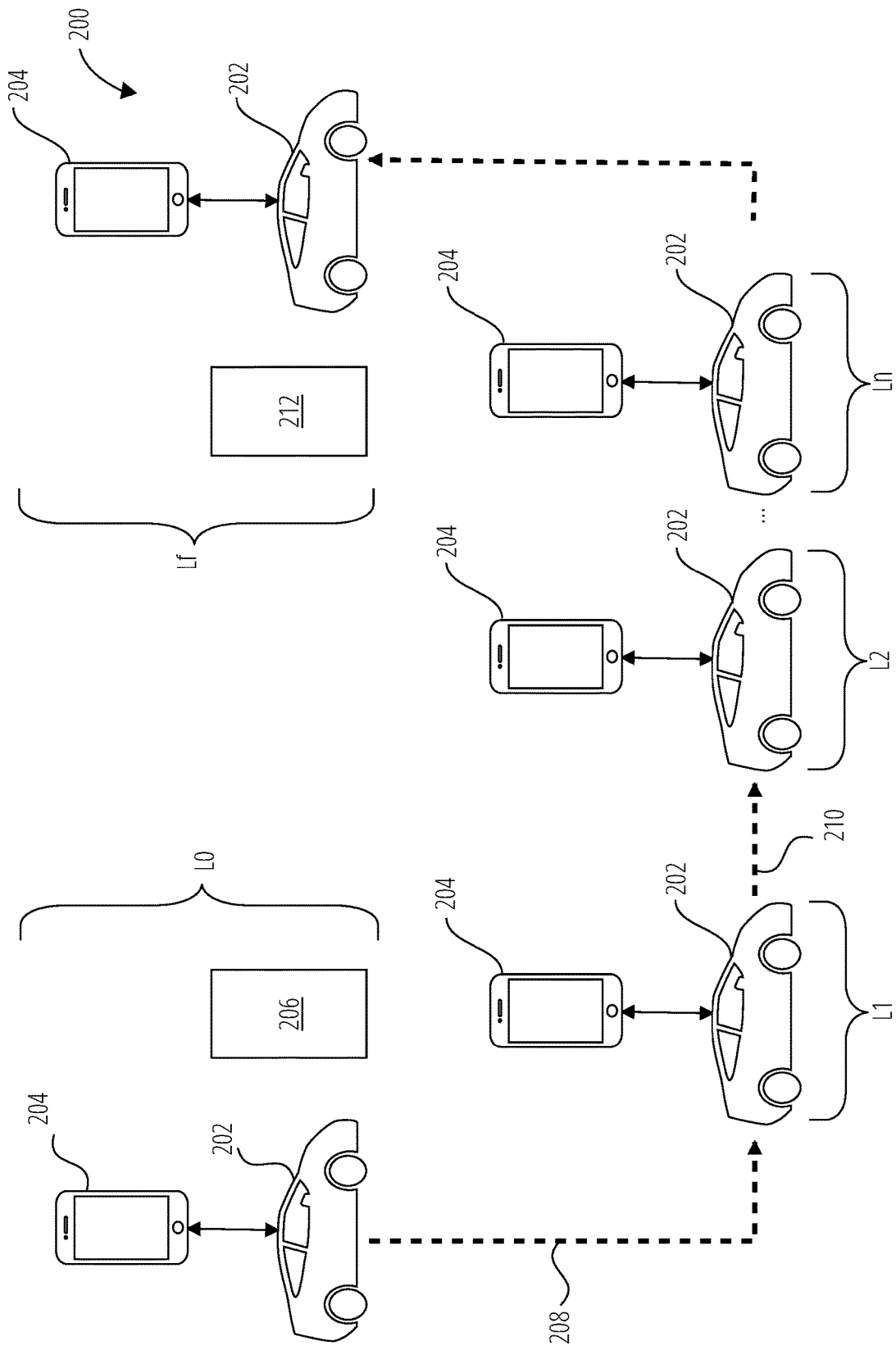
FIG. 2 shows a diagram of estimating vehicle SoC, according to some embodiments.

FIG. 2 shows a diagram 200 of estimating vehicle SoC according to some embodiments of the disclosure. The vehicle 202 may be similar and/or analogous to a vehicle 102, the computing device 204 may be similar and/or analogous to a computing device 106, and the charging stations 206 and 212 may be similar and/or analogous a charging station 104 of FIG. 1. In some embodiments, the computing device 204 is a device of a driver of, occupant of, or individual otherwise associated with the vehicle 202.

In the embodiment of FIG. 2, at a location L0, the computing device 204 and the vehicle 202 may establish or already have established connectivity or communication with each other. For example, the connectivity or communication may be via a short range communication protocol such as Bluetooth. The Bluetooth connectivity may provide, for example, hands-free use of a computing device 204 by a driver of the vehicle 202 for one or more of telephone call(s), messaging (e.g., text messaging), and music control during operation of the vehicle 202. In some embodiments, the computing device 204 receives or obtains and/or stores a MAC address of the vehicle 202 when communicating with the vehicle 202. The computing device 204 may store a time at the location L0 when the computing device 204 first receives the MAC address of the vehicle 202. The computing device 204 may further store initial location data (e.g., data reflecting GPS coordinates and/or street address) of the computing device 204 at the time when it first obtains the MAC address of the vehicle 202, reflecting the location L0. For example, the computing device 204 may store the initial location data of the computing device 204 at a time when connectivity with the vehicle 202 was first initiated. The initial location data may be determined by the computing device 204 using GPS or other location circuitry of the computing device 204 or the vehicle 202. The location may correspond to the location of the vehicle 202 at location L0, for example, if the computing device 204 is in short range communication and therefore close in proximity to the vehicle 202.

At location L0, the vehicle 202 may be located at a charging station 206. In some embodiments, the computing device 204 communicates with the charging station 206 (e.g., via short range communication such as Bluetooth or via other communication that uses WIFI, LAN, WAN, or cellular communication). In some embodiments, the computing device 204 communicates with the charging station 206 via a network (e.g., a network 112). In some embodiments, the computing device 204 communicates with the charging station 206 via a network 112 and/or another computing device, such as a computing device 110. For example, a computing device 110 may communicate with both the computing device 204 and the charging station 206 via a network 112, and the computing device 110 may facilitate communication between the computing device 204 and the charging station 206. In some embodiments, the computing device 110 may provide authentication for one or both of the computing device 204 and the charging station 206. In some embodiments, the computing device 110 may control charging of the vehicle 202 by the charging station 206 and/or determine an estimated SoC of the vehicle 202 for use by the charging station 206 during the charging.

At location L0, an estimate of the vehicle 202 SoC may be determined. For example, the vehicle 202 may estimate the SoC of its battery. The computing device 204 may obtain or receive the estimated SoC. In another example, based on prior SoC data for the vehicle 202, the computing device 204 or another computing device (e.g., computing device 110) may determine an estimated SoC of the vehicle 202. The prior SoC data for the vehicle 202 may be, for example, an estimated SoC of the vehicle at the end of an immediately previous trip and/or an SoC of the vehicle at the end of one or more previous trips. Additionally, or alternatively, the estimated SoC may be based on one or more vehicle characteristics, discussed below.

For example, the initial location data at a location L0, discussed above, may reflect a location of a charging station 206. For example, the charging station 206 may be used to charge a battery of a vehicle 202. The estimated SoC for the vehicle 202 may also be determined at the location L0 based on charging by the charging station 206. For example, after the charging station 206 charges a battery of the vehicle 202, the estimated SoC of a battery of the vehicle 202 may be determined by one or more of the charging station 206, the vehicle 202, the computing device 204, and/or the computing device 110. The estimated SoC may be transmitted to or received by the computing device 204 and/or the computing device 110. It should be noted that the estimated SoC at the location L0 may be determined using the same or similar processes discussed below for SoC estimating at a location L1.

Vehicle 202 may be driven along a route 208 to a new location L1. The vehicle 202 and the computing device 204 may be located at the location L1. For example, the route 208 is a trip from the location L0 to the location L1. At the location L1, a distance traveled by the vehicle 202 along the route 208 may be estimated. In some embodiments, the stored initial location data of the computing device 204 reflecting where the device was located when it was initially connected to a selected vehicle (e.g., vehicle 202) and stored the vehicle's MAC address (e.g., at location L0) is determined. The current location data (e.g., street address and/or GPS coordinates) of the computing device 204 (e.g., at location L1) may also be determined and stored by the computing device 204. The storage may be locally on the computing device 204 or at a remote location (e.g., database 108). Further, the initial location data and/or current location data may be transmitted to a remote computing device (e.g., computing device 110).

The current location of the computing device 204 may correspond or be proximal to the current location of the vehicle 202. In some embodiments, the current location of the computing device 204 may be conditioned on present connectivity with the vehicle 202. For example, to ensure that the determined current location of the computing device 204 corresponds or at least approximates the current location of the vehicle 202, the determined current location may only be determined if Bluetooth connectivity with the vehicle 202 is active. It should be noted that connectivity between the computing device 204 and the vehicle 202 need not be constant. In some embodiments, the computing device 204 and the vehicle 202 are connected for a first time period when determining the current location of the computing device 204, but are not connected for a second time period when the current location of the computing device 204 is not being determined.

In some embodiments, the distance between the current location and the initial location is determined by a computing device 204 and/or a computing device 110. The distance may be determined by analyzing one or more map routes between the current location and the initial location (e.g., between L0 and L1) and determining the distance of a most likely route. The most likely route may be, for example, the shortest distance route, the route avoiding one or more tolls, the route avoiding or using freeways, or the route having the shortest estimated travel time. The determined distance may be used as an estimate for a distance traveled by the vehicle 202 along the actual route 208 between the location L0 and the location L1.

In some embodiments, the vehicle 202 SoC at the location L1 is estimated by the computing device 204 using the determined distance. In some embodiments, the vehicle 202 SoC is estimated using the determined distance as well as one or more of an estimated SoC at the end of the vehicle's previous trip, an estimated SoC at the previous location (e.g., location L0), and/or one or more vehicle characteristics (e.g., mileage per kWh, battery size, battery charge capacity, etc.). For example, a user (e.g., vehicle driver or passenger) of the computing device 204 may select one or more vehicle characteristics to specify a certain vehicle 202 configuration that impacts the SoC determination. In another example, vehicle characteristics may be preselected for a particular vehicle and/or obtained from a third-party (e.g., a database of the vehicle manufacturer). In some embodiments, historical data for the vehicle 202 is used alone or in conjunction with one or more of the determined distance, the estimated SoC at the end of the vehicle's previous trip or at the previous location (e.g., at the location L0), and the one or more vehicle characteristics, to estimate the SoC of the vehicle 202. The historical data may include one or more of distance traveled on one or more previous trips, mileage per kWh for one or more previous trips, vehicle energy use from operating air conditioning or heating for one or more previous trips, weather conditions from for one or more previous trips, vehicle energy expenditure for one or more previous city driving trips, vehicle energy expenditure for one or more previous highway and/or freeway driving trips, and the like.

In some embodiments, the vehicle SoC estimation uses one or more of a trip distance, route, terrain information, time of day, day of the week, traffic, road condition, vehicle information, weather, and/or vehicle user driving behavior.

In some embodiments, the vehicle 202 SoC is estimated by a model trained using data received (e.g., over Bluetooth or a network such as network 112) by a computing device (e.g., 204, 106, 110) from the vehicle 202. In some embodiments, the model is a regression based machine learning model. In some embodiments, the model uses feedback to fine tune the estimated SoC. In some embodiments, the model uses one or more of distance traveled, vehicle information, an initial SoC, and/or other parameters to estimate SoC.

In some embodiments, a distance traveled by the vehicle 202 may be determined using location data as discussed herein and is used to estimate SoC. In some embodiments, a hypothetical distance traveled by the vehicle for a future trip from a start location to end location may be determined and used to estimate SoC at the end location.

In some embodiments, vehicle information relevant to estimating SoC such as charging history, one or more charging patterns, and manufacturer specifications of the vehicle and/or battery may be registered by a user or retrieved from a third party (e.g., the vehicle manufacturer) and stored in the database 108, and a computing device may access the information to estimate SoC. In some embodiments, the vehicle information includes a charging profile of the vehicle's battery (e.g., obtained from the vehicle or from the manufacturer) that is used to estimate the SoC.

In some embodiments, an initial SoC is used to estimate the SoC. The initial SoC may be the initial state of the vehicle battery when the user starts driving or after completion of the last charging session. For example, the initial SoC may be based on an SoC measurement after completion of the last charging session and may account for parasitic power loss and other standby loss factors. In some embodiments, the last charging session is completed due to an end of charge (e.g., the battery is at capacity and cannot be further charged). In some embodiments, the last charging session is completed because a predetermined charge level (e.g., set by a user via the vehicle or a computing device (e.g., 106, 204)) is met. In some embodiments, the initial SoC is input by a user via the vehicle or a computing device (e.g., 106, 204).

In some embodiments, the other parameters used to estimate SoC charge include one or more of the following: heating, ventilation, and air conditioning (HVAC) load for the vehicle (e.g., whether heating or air conditioning is on or off and patterns of usage), slope of the road or surface traveled by the vehicle, external weather parameters in the vicinity of the vehicle or at previous locations the vehicle traveled to or through (e.g., temperature, windspeed, etc.), vehicle speed during one or more previous trips, total time-taken between start and destination locations for one or more previous trips, total drive time during one or more previous trips, one or more stops made during one or more previous trips and frequency of stops, the type of route taken during one or more previous trips (e.g., city route, freeway, off-road, rural, etc.).

In some embodiments, the model that estimates the vehicle 202 SoC uses machine learning to refine the model and provide improved vehicle SoC estimations as more data is obtained for a particular vehicle. In some embodiments, the model uses machine learning combined with online learning which fetches additional data (e.g., via network 108) as more relevant data becomes available to refine the model and provide improved vehicle SoC estimations.

The output of the model will be the estimated SoC. In some embodiments, the estimated SoC is of the current SoC. In some embodiments, the estimated SoC is an estimate of the vehicle's SoC at a future location, such as a trip destination. In some embodiments, a driver is notified of one or more of the vehicle SoC, degradation of the vehicle battery or SoC, an alert to charge when a charging station is located in a vicinity of the vehicle (e.g., within 1 mile, 5 miles, 10 miles) and the SoC is below a predetermined threshold, an alert for a low SoC (e.g., the SoC is below a predetermined threshold), and/or one or more route modifications for a trip based on the estimated SoC. The alerts may be provided to the vehicle 202, which may provide an audible notification sound and/or provide a notification window on a display or heads-up projection of the vehicle 202. The alerts may be provided to a computing device (e.g., computing device 106, 204) of a user (e.g., of the vehicle driver or a passenger), which may make an audible sound and/or provide a notification window on a display of the device.

In some embodiments, alone or in combination with the aspects noted above, the SoC of the vehicle 202 is estimated using one or more of distance traveled, vehicle information, an initial SoC, and/or other parameters from one or more other vehicles that are not the vehicle 202. For instance, users associated with the one or more other vehicles may provide the database 108 with access (e.g., via API credentials) to distance traveled, vehicle information, an initial SoC, and/or the other parameters, and the SoC for the vehicle 202 may be estimated by the model by using this information of one or more other vehicles. In some embodiments, this information of the one or more other vehicles may be from a time when a charging session is completed for the other vehicle(s) and/or when a user configures the SoC manually for the other vehicle(s).

It should be noted that in some embodiments, the vehicle 202 is not required to provide API credentials such that its own information is used to determine the SoC of other vehicles. Accordingly, two populations of vehicles may exist—a first population where users provided credentials such that vehicle information can be accessed to determine estimated SoC, and a second population where users did not provide credentials. In some embodiments, the SoC for each vehicle of the first population is estimated using its own vehicle information (e.g., one or more of its own distance traveled, vehicle information, an initial SoC, and/or other parameters) and/or vehicle information of other vehicles in the first population. In some embodiments, the SoC for each vehicle of the second population is estimated using its own vehicle information (e.g., one or more of its own distance traveled, vehicle information, an initial SoC, and/or other parameters) and/or vehicle information of other vehicles in the first population.

We can use the learning algorithm on the first population to predict the SoC for the second population, using anchor points of "good known data", which happen when a car completes a charging session, or when the user configures the SoC manually, so we can be certain of what the SoC is at that point.

As noted above, when provided with the SoC estimate, a driver may be notified of a decreased state of charge of the vehicle's battery, a nearby charging station, and may be aided in route planning. As a long-term benefit, users may also be better informed of vehicle battery health and degradation based on long term usage, driving and charge patterns, and battery cycling, for example.

With reference again to FIG. 2, in some embodiments, the vehicle 202 SoC is determined immediately after the vehicle 202 arrives at the location L1. In some embodiments, the vehicle 202 SoC is determined after a certain time period after arriving at the location L1. Here, for example, the battery of the vehicle 202 may experience battery drain or loss. Therefore, the vehicle 202 SoC may need to account for or determine such battery drain or loss. In some embodiments, data regarding battery drain or loss in vehicles having similar characteristics (e.g., similar or same mileage per kWh, battery size, battery charge capacity, etc.) to the vehicle 202 is used to estimate battery drain or loss in the vehicle 202, which may then be used to determine the SoC of the vehicle 202 at the location L1. In some embodiments, the data regarding battery drain or loss may be obtained from the vehicles having similar characteristics to the vehicle 202 that have an application programming interface ("API") connection with/to one or more of the database 108 and/or the computing device 110.

After the location L1, the vehicle 202 may travel to one or more of a location L2 along a route 210 and to one or more of a subsequent location Ln, and then arrive at a location Lf where a charging station 212 is located. Similar or the same processes as those that have been described as occurring at the location L1 above may also occur at one or more of the locations L2 to Ln, as well as at the location Lf, such that an estimated vehicle 202 SoC is determined at the location Lf. It should also be noted that a vehicle may travel directly from the location L0 to the location Lf without intermediate trips to the locations L1, L2, and Ln.

At the location Lf, in some embodiments, the computing device 204 communicates with the charging station 212 (e.g., via short range communication such as Bluetooth or via other communication that uses WIFI, LAN, WAN, or cellular communication). In some embodiments, the computing device 204 communicates with the charging station 212 via a network (e.g., network 112). In some embodiments, the computing device 204 communicates with the charging station 212 via the network 112 and/or another computing device, such as the computing device 110. For example, the computing device 110 may communicate with both the computing device 204 and the charging station 212 via the network 112, and the computing device 110 may facilitate communication between the computing device 204 and the charging station 212. In some embodiments, the computing device 110 may provide authentication for one or both of the computing device 204 and the charging station 212. In some embodiments, the computing device 110 may control charging of the vehicle 202 by the charging station 212 and/or determine an estimated SoC of the vehicle 202 for use by the charging station 212 during the charging.

At a location Lf, the estimated SoC for the vehicle 202 may be determined using the same or similar process as described above at a location L1. In some embodiments, the SoC estimation at the location Lf includes determining the estimated SoC at the location L0 when the vehicle 202 was last charged (e.g., at location L0 by charging station 206) and determining a change in the SoC at the location L0 based on the SoC estimations at one of more of the locations L1, L2, and Ln. In some embodiments, the SoC estimation at the location Lf includes determining a total distance traveled by the vehicle 202 since its last charge (e.g., at location L0 by charging station 206). For example, the SoC estimating may include determining the distance traveled by the vehicle 202 since its last charge by determining when the computing device 204 was in communication with the vehicle 202 (e.g., via Bluetooth) and analyzing location data of the computing device 204 when the communication occurred. Moreover, the SoC estimation at the location Lf may be performed using the same or similar process as that described above at the location L1.

The computing device 204 may be used to control charging of the vehicle 202 by the charging station 212. In some embodiments, the control is provided via an application or other software of the computing device 204, or by software of an external database (e.g., database 108 of FIG. 1) accessed via the computing device 204. In some embodiments, another computing device, such as computing device 110, executes an application or other software to facilitate the charging of the vehicle 202, and is directed by the computing device 204.

In some embodiments, the estimated SoC is transmitted by one or more of the computing device 204, computing device 110, or database 108 to the charging station 212. In other embodiments, the charging station 212 determines the estimated SoC for the vehicle 202 itself at the location Lf, using the processes discussed herein and the relevant data discussed above, which may be received by the charging station 212 from one or more of the computing device 204, the database 108, and/or the computing device 110.

Alternatively or in addition to the aspects used to estimate the vehicle 202 SoC discussed herein, the computing devices and/or charging stations may use time between driving sessions and/or environmental conditions for a previous, current, or future period of time or location to estimate the vehicle 202 SoC.

In some embodiments, the vehicle 202 SoC is determined immediately after the vehicle 202 arrives at the charging station 212 at the location Lf. In some embodiments, the vehicle 202 SoC is determined after a certain time period after arriving at the charging station 212 at the location Lf. In some embodiments, charging of the vehicle 202 may occur when the vehicle 202 arrives at the charging station 212. In some embodiments, charging of the vehicle 202 may occur a certain time period after the vehicle 202 arrives at the charging station 212. Here, for example, the battery of the vehicle 202 may experience battery drain or loss until the vehicle 202 is charged. Therefore, the vehicle 202 SoC may need to account for or determine such battery drain or loss to determine the amount of charging by the charging station 212. In some embodiments, data regarding battery drain or loss in vehicles having similar characteristics (e.g., similar or same mileage per kWh, battery size, battery charge capacity, etc.) to the vehicle 202 is used to estimate battery drain or loss in the vehicle 202, which may then be used to determine SoC of the vehicle 202 at the location Lf. In some embodiments, the data regarding battery drain or loss may be obtained from the vehicles having similar characteristics to the vehicle 202 that have an API connection with/to one or more of the databases 108 and/or one or more of the computing devices 110.

In some embodiments, the charging station 212 uses the estimated SoC for the vehicle 202 to determine one or more of an allocation of power for charging of the vehicle 202 and a charging time for the vehicle 202. For example, by estimating vehicle SoC, allocation of power between multiple vehicles being charged by the same power source (e.g., charging station 212) can be improved. For example, one or more vehicles having an increased need or required amount of power may be allocated more power for charging than others with less of a need. For example, the charging station 212 may allocate power to the vehicle 202 that charges the vehicle 202 to a certain level such that power expended during a last trip is replenished. For example, the user may select a charging level (e.g., via a computing device 204) that is a certain percentage of total battery capacity. In some embodiments, the allocation of power does not fully charge the vehicle 202. In other embodiments, the allocation of power does fully charge the vehicle 202.

In some embodiments, a vehicle is selected for charging before charging occurs. In some embodiments, the computing device 204 automatically selects a vehicle (e.g., vehicle 202) for charging or charging control using a recent MAC address stored on the device. For example, the computing device 204 may determine if one or more MAC addresses stored by the computing device 204 during a predetermined recent time period (e.g., last 5 minutes, last 10 minutes, last 30 minutes, last hour, etc.) match to a vehicle MAC address stored in the database 108 and associated with a driver profile. In another example, the computing device 204 may determine if one or more initial MAC address instances for a most recent Bluetooth connectivity session (e.g., first MAC address instance saved by the computing device 204 for a most recent Bluetooth connectivity session) match to a vehicle MAC address stored in the database 108 and associated with a driver profile. If there is match between one or more MAC addresses stored by the computing device 204 and a vehicle MAC address stored in the database 108, then the computing device 204 may automatically determine that the electric charging control is for the vehicle having the vehicle MAC address. The computing device 204 may thereafter control charging of the vehicle, for example, in accordance with one or more vehicle-specific characteristics, such as mileage per kWh, battery size, and/or charging capacity.

In some embodiments, the computing device 204 is used to select a vehicle (e.g., vehicle 202) semi-automatically for charging or charging control. For example, a user may be prompted by the computing device 204 (e.g., by software or an application on the computing device 204 or accessed by the computing device 204) to select a vehicle. The vehicle may be selected from a profile associated with a particular user or driver. In another example, when a user has previously indicated that a different vehicle is subject to charging functions, the user may be asked (e.g., by software or an application on the computing device 204 or accessed by the computing device 204) whether the user is instead driving the vehicle recognized using a stored MAC address (as discussed above) and/or whether the recognized vehicle should be subject to electric charging or charging control.

In some embodiments, when a vehicle 202 is at a location (e.g., L1, L2, . . . Ln, Lf) and when the computing device 204 is moved away from the vehicle 202 (e.g., when a driver or vehicle occupant carrying the computing device 204 exits the vehicle 202), connectivity (e.g., Bluetooth connectivity) between the vehicle 202 and the computing device 204 terminates. In some embodiments, when the computing device 204 is brought back into connectivity range of the vehicle 202 (e.g., the driver or vehicle occupant carrying the computing device 204 enters the vehicle 202), another instance of connectivity between the computing device 204 and the vehicle 202 is established.

Figure 3:
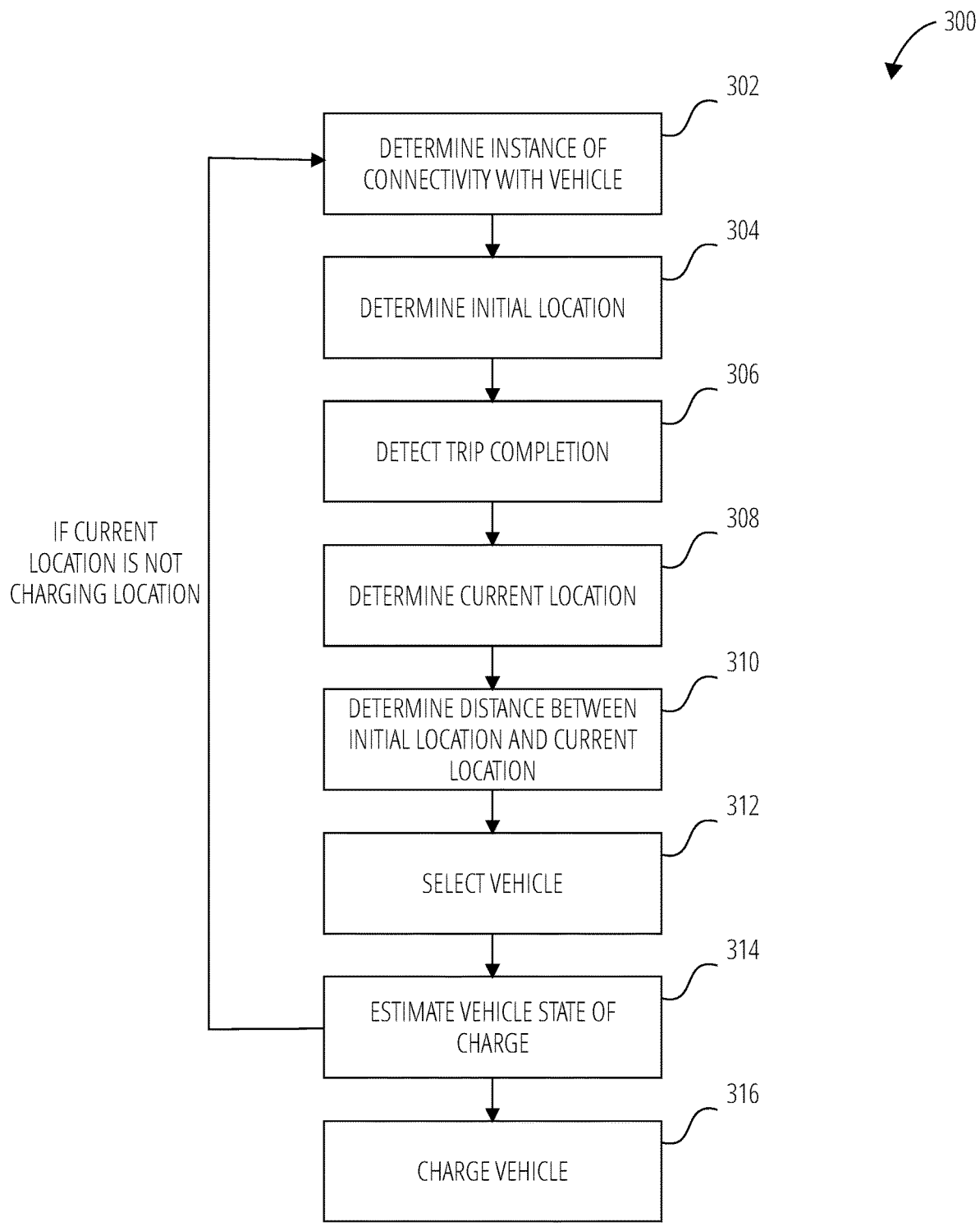
FIG. 3 shows a flow diagram of a process of estimating vehicle SoC, according to some embodiments.

FIG. 3 is a flow diagram of a process 300 of estimating vehicle SoC according to some embodiments of the present disclosure.

At block 302, a computing device (e.g., computing device 106, 204) may determine an instance of connectivity between a vehicle (e.g., vehicle 102, 202) and the computing device. In some embodiments, the instance of connectivity is an initial instance of connectivity between the computing device and the vehicle that occurs for a particular trip. For example, the instance of connectivity may be an instance of Bluetooth connectivity between the computing device and the vehicle where a MAC address of the vehicle is received or obtained by the computing device from the vehicle. For example, the instance of connectivity may occur at and/or reflect a time when a driver or occupant with the computing device first entered the vehicle or was located within a predetermined distance (e.g., one foot, two feet, five feet, etc.) of the vehicle.

At block 304, the computing device may determine an initial location (e.g., address, GPS coordinates). In some embodiments, the computing device determines the initial location using GPS circuitry and/or memory of the computing device. In some embodiments, the initial location is the location of the computing device at the time that or when the initial instance of connectivity between the computing device and the vehicle occurs or is determined. In some embodiments, the initial location is the location of the computing device at a time (e.g., a predetermined time such as 30 seconds, five minutes, 10 minutes, etc.) after the initial instance of connectivity between the computing device and the vehicle occurs. In some embodiments, the initial location is the most recently stored location of the computing device before the initial instance of connectivity between the computing device and the vehicle occurs. After block 304, the vehicle may travel or move to a different location away from the initial location. This traveling or movement from the initial location to a different location is referred to as a "trip."

At block 306, the computing device may detect completion of the trip. In some embodiments, the computing device determines trip completion autonomously using or based on one or more measurements from on onboard accelerometer (e.g., one or more measurements showing or indicating lack of movement). In some embodiments, the computing device may detect a received input from a user via a user interface (e.g., by selecting an option on a touch screen, pressing a button, etc.) that indicates trip completion. In some embodiments, the computing device may prompt a user to inform it of whether a trip is completed. For example, the computing device may sense a vehicle is stopped, but may not know if this stoppage is the end of a trip. Thus, the computing device may ask a user, for example by a message delivered to a graphical user interface of the computing device, whether the trip is completed, and solicit the user to interact with the interface or use a voice command to indicate that the trip is completed or not completed. In some embodiments, detecting the completion of the trip may include detecting arrival or current location at a location associated with a charging station (e.g., a location where a charging station configured to charge a battery of the vehicle is present).

At block 308, the computing device may determine a current location (e.g., address, GPS coordinates). In some embodiments, the current location corresponds to the current location of the vehicle. In some embodiments, the current location is the different location away from the initial location that the vehicle travels or moves to, and the trip reflects movement from the initial location to the current location. In some embodiments, the computing device determines the current location using GPS circuitry and/or memory of the computing device. In some embodiments, the computing device receives a current location (e.g., GPS data or coordinates or another type of location coordinates) from a charging station located within a proximity of the computing device. For example, the charging station may have a programmed or predetermined location, and may transmit that location to the computing device (e.g., directly or via another computing device such as a computing device 110) when the computing device is located within a proximity or predetermined distance (e.g., five feet, 10 feet, 50 feet, 100 feet, etc.) of the charging station. In some embodiments, the determined current location and initial location (of block 304) are transmitted by the computing device to the charging station (e.g., directly or via another computing device 110). In still other embodiments, the computing device receives a current location from the vehicle to which it has a present instance of connectivity (e.g., from GPS circuitry of the vehicle).

At block 310, a distance between the initial location and the current location is determined. In some embodiments, the distance is determined by analyzing one or more map routes between the current location and the initial location and determining the distance of a most likely route. The most likely route may be, for example, the shortest distance route, the route avoiding one or more tolls, the route avoiding or using freeways, or the route having the shortest estimated travel time. In some embodiments, the processing to determine block 310 is performed by the computing device 106. In some embodiments, the processing to determine block 310 is performed by the computing device 110. In other embodiments, the processing to determine block 310 is performed by the charging station after it receives the determined current location and initial location (e.g., from computing device 106 or 110).

At block 312, the vehicle is selected for charging. The selecting may be automatic or semi-automatic, as discussed above with respect to FIG. 2.

At block 314, a SoC for the vehicle is estimated. The estimating may be performed as discussed above with respect to FIG. 2. In some embodiments, the estimating is performed by the computing device and then transmitted to the charging station. In some embodiments, the estimating is performed by the charging station. In some embodiments, the estimating is performed by another computing device (e.g., computing device 110).

In some embodiments, SoC is estimated. In some embodiments, the SoC is estimated using the determined distance of block 310. In some embodiments, the SoC is estimated using the determined distance of block 310 and one or more of the following: one or more previously calculated trip distances reflecting distances traveled during one or more trips since a last charge of the vehicle; one or more previously estimated SoC estimated at the end of one or more previous trips since the last charge of the vehicle; one or more previously estimated SoC estimated at one or more previous locations (directly previous or otherwise previous) of the vehicle; one or more vehicle characteristics (e.g., mileage per kWh, battery size, charge capacity). The estimated SoC may account for one or more previous trips taken by the vehicle since it was last charged, such that the estimated SoC reflects how the vehicle's SoC has decreased since the SoC immediately after it was last charged. For example, a user may select one or more vehicle characteristics to specify a certain vehicle configuration and impact the SoC determination. In another example, vehicle characteristics may be preselected for a particular vehicle and/or obtained from a third-party (e.g., a database of the vehicle manufacturer).

After block 314, the process 300 may continue to block 316 for charging if the current location corresponds to a charging location where a charging station is located. If the current location does not correspond to a charging location, then the process 300 continues to block 302.

At block 316, the vehicle is charged by the charging station using the estimated SoC. In some embodiments, the estimated SoC is used to determine one or more of an allocation of electric power for charging the vehicle and a charging time of the vehicle. For example, by estimating vehicle SoC, allocation of power between multiple vehicles being charged by the same power source (e.g., charging stations 104, 206, 212) can be improved. For example, the charging station may allocate power to the vehicle such that the vehicle is charged to a certain level. The level may be preselected by the user as a certain percentage of total battery capacity.

Figure 4:
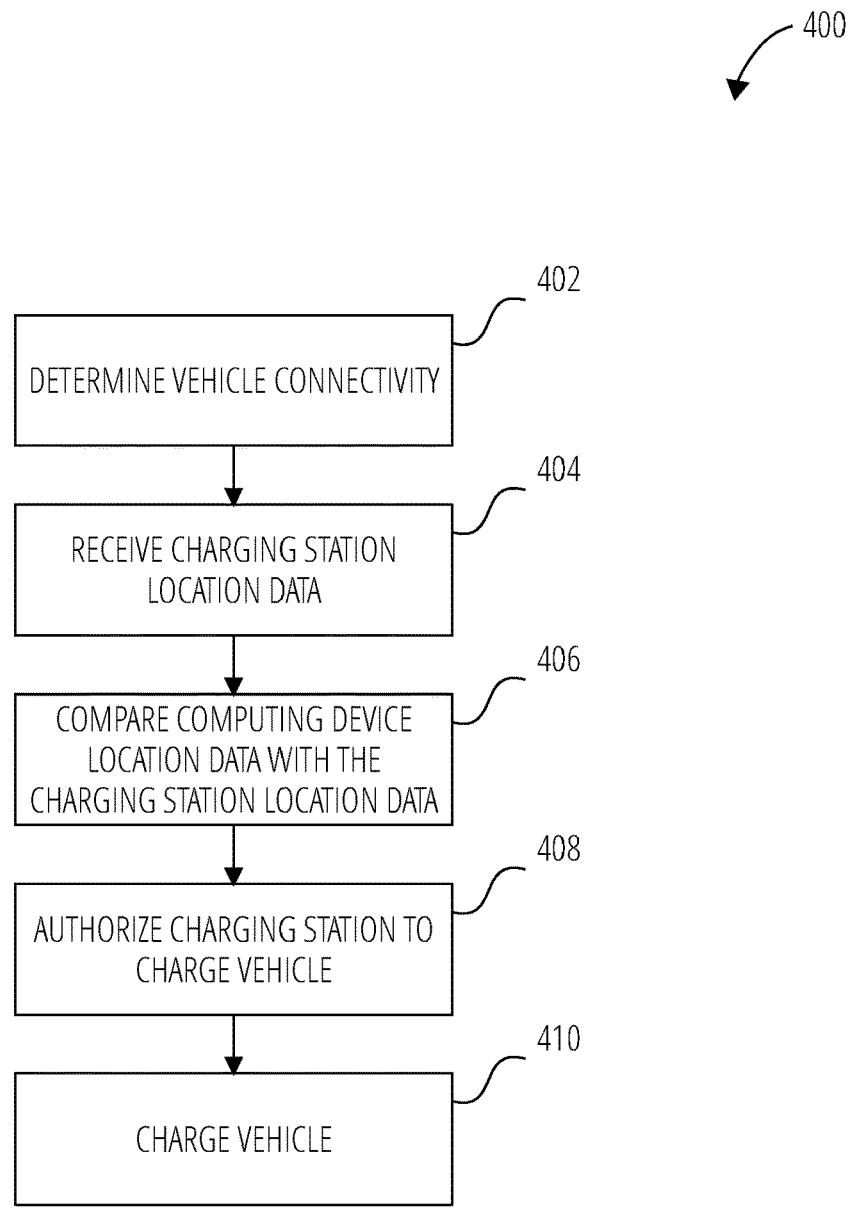
FIG. 4 shows a flow diagram of a process of authorizing vehicle charging, according to some embodiments.

FIG. 4 is a flow diagram of a process 400 of authorizing vehicle battery charging, according to some embodiments of the present disclosure. In some embodiments, charging by a charging station (e.g., charging stations 104, 206, 212) is authorized using location data associated with user's computing device (e.g., computing devices 106, 204). For example, the user's computing device may be in communication with a vehicle (e.g., vehicles 102, 202) and may be used as a proxy for the location of a vehicle in relation to a charging station. In some embodiments, direct connectivity between the vehicle and the charging station is not necessary for charging authorization.

At block 402, a computing device (e.g., computing devices 106, 204) determines communicative connectivity with a vehicle to be charged (e.g., vehicles 102, 202). In some embodiments, the connectivity is Bluetooth connectivity. In some embodiments, a Bluetooth MAC address of the vehicle is matched to profile data for a vehicle driver reflecting information about the vehicle. In some embodiments, process 400 continues to block 404 when the computing device determines that there exists communicative connectivity between the vehicle to be charged and the computing device.

At block 404, the computing device obtains or receives location data of the charging station. In some embodiments, the location data of the charging station includes GPS coordinate data of the charging station and/or triangulation (e.g., via WIFI) coordinate data of the charging station. The location data of the charging station may be received or obtained by the computing device directly from the charging station, indirectly from the charging station via a network (e.g., network 112), or from another computing device (e.g., computing device 110) or from a database (e.g., database 108).

At block 406, the computing device compares location data of the computing device with the location data of the charging station to determine a location match. In some embodiments, GPS coordinate data of the computing device is compared to GPS coordinate data of the charging station to determine the location match. In some embodiments, triangulation coordinate data of the computing device (e.g., via WIFI) is compared to GPS coordinate data or triangulation coordinate data of the charging station to determine the location match. In some embodiments, the location match occurs when the coordinate data of the computing device and the charging station are the same or identical or within a threshold range of each other. For example, the threshold range may specify a particular distance (e.g., one foot, two feet, five feet, etc.) from the charging station within which the computing device may be located to cause a location match between the computing device and the charging station to occur. In some embodiments, a user places the computing device on the charging station or on a holder or stand of the charging station such that the computing device and charging station location data match. In some embodiments, the user need not open or otherwise access a particular application or software of the computing device for the comparison of location data to occur. In some embodiments, process 400 continues to block 408 when the computing device determines that the location match has occurred.

At block 408, the computing device authorizes the charging station for charging a battery of the vehicle. In some embodiments, the authorization automatically occurs once the location match of block 406 is determined (e.g., the locations of the computing device and the charging station are the same or identical or within a range). In some embodiments, the user is prompted to confirm location or provide some other user confirmation associated with the authorization (e.g., via interaction with a user interface of the computing device) and, after the confirmation, the computing device authorizes the charging station for the charging.

At block 410, the charging station provides electricity to the vehicle battery to charge the battery.

It should be noted that one or both of processes 300 and 400 may be performed for a vehicle, and/or that one or more blocks of process 300 and one or more blocks of process 400 may be performed in a combined process. Moreover, it should be noted that processes 300 and 400 may be performed in whole or in part by a charging station 104, computing device 106, database 108, computing device 110, computing device 204, charging station 206, and/or charging station 212.

In some embodiments, the process 400 does not require connectivity between the vehicle and the charging station, and likewise does not require integration between an API of the vehicle and the charging station. In some embodiments, the process 400 does not require specific pairing between the computing device and the charging station. For example, the computing device may obtain or receive location data from the charging station, or may obtain or receive location data reflecting the charging station's location from one or more other devices (e.g., database 108, computing device 110).

Figure 5:
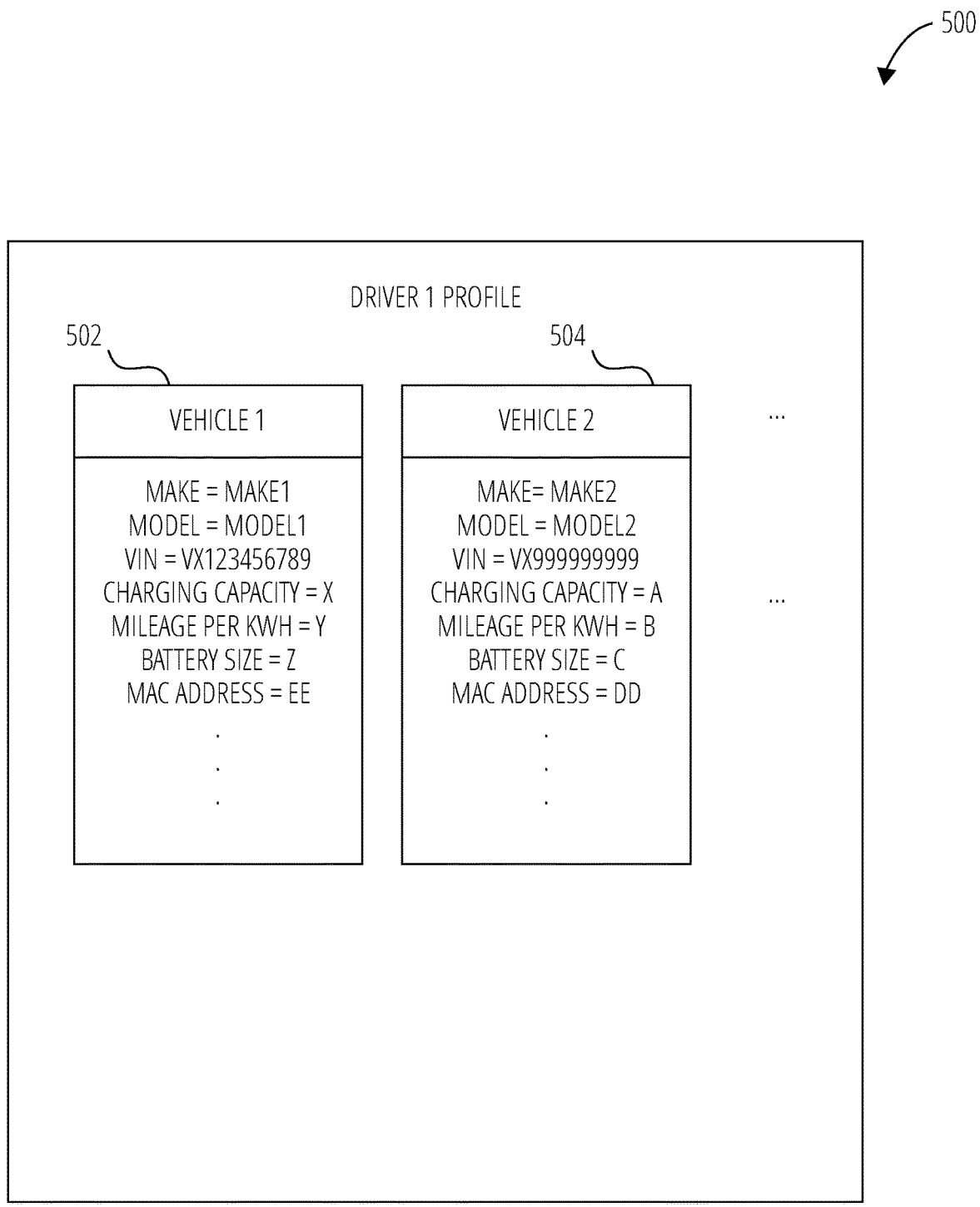
FIG. 5 shows a vehicle driver profile, according to some embodiments.

FIG. 5 shows a driver profile 500 containing vehicle information for a driver in accordance with some embodiments of the disclosure. In some embodiments, the driver profile 500 is stored in a database (e.g., database 108) that communicates with a driver's computing device and/or vehicle and/or charging station used by the driver. In some embodiments, the driver profile is stored locally on a computing device (e.g., computing device 106, 110, 204). In some embodiments, the driver profile 500 is stored in an onboard computer memory of a vehicle (e.g., vehicle 102). In some embodiments, the driver profile 500 includes data regarding one or more vehicles owned by, leased by, or otherwise in possession (e.g., rented) of a driver. In the embodiment shown, the profile 500 for driver 1 includes a vehicle 1 and a vehicle 2. Vehicle 1 has associated data 502 which includes, for example, vehicle make, model, vehicle identification number ("VIN"), charging capacity, mileage per kWh, battery size, and MAC address. Vehicle 2 has data 504 including similar information. It should be noted that more or less data may be included in each driver profile 500 and/or in data 502, 504.

Furthermore, the described features, operations, or characteristics may be arranged and designed in a wide variety of different configurations and/or combined in any suitable manner in one or more embodiments. Thus, the detailed description of the embodiments of the systems and methods is not intended to limit the scope of the disclosure, as claimed, but is merely representative of possible embodiments of the disclosure. In addition, it will also be readily understood that the order of the steps or actions of the methods described in connection with the embodiments disclosed may be changed as would be apparent to those skilled in the art. Thus, any order in the drawings or Detailed Descriptions is for illustrative purposes only and is not meant to imply a required order, unless specified to require an order.

Embodiments may include various steps, which may be embodied in machine-executable instructions to be executed by a general-purpose or special-purpose computer (or other electronic device). Alternatively, the steps may be performed by hardware components that include specific logic for performing the steps, or by a combination of hardware, software, and/or firmware.

At least some embodiments may comprise a computer program product including a computer-readable storage medium having stored instructions and/or data thereon that may be used to program a computer (or other electronic device) to perform processes described herein. The computer-readable storage medium comprises at least a non-transient storage medium, such as, e.g., a hard drive, a fixed disk, a removable disk, a floppy diskette, an optical disk, a CD-ROM, a CD-RW, a DVD-ROM, a DVD-RW, a read-only memory ("ROM"), a random access memory (RAM), an erasable programmable ROM (EPROM), an electrically erasable programmable ROM (EEPROM), a magnetic card, an optical card, a solid-state memory device, or other types of media/machine-readable media suitable for storing electronic instructions and/or data.

A software module, module, or component may include any type of computer instruction or computer executable code located within a memory device and/or computer-readable storage medium, as is well known in the art.

It will be obvious to those having skill in the art that many changes may be made to the details of the above described embodiments without departing from the underlying principles of the invention.

The invention claimed is:

1. A computing device for charging an electric vehicle based on an estimated state of charge of the electric vehicle, comprising:
   a network interface to provide network connectivity over a communication network;
   one or more processors; and
   a memory storing instructions that, when executed by the one or more processors, cause the computing device to:
      receive, from a mobile device, location data of the mobile device reflecting a distance traveled by an electric vehicle during one or more instances of connectivity between the electric vehicle and the mobile device;
      receive, from the mobile device, a user input indicating selection corresponding to a media access control (MAC) address of the electric vehicle;
      determine an estimated state of charge of the electric vehicle based on the received location data;
      receive, from the mobile device, a current location of the mobile device that reflects a current location of the electric vehicle;
      determine that the current location of the mobile device is within a predetermined distance of a known location of a charging station;
      transmit the estimated state of charge to the charging station; and
      authorize the charging station to charge the electric vehicle using the estimated state of charge.

2. The computing device of claim 1, wherein a first instance of connectivity occurs when a driver or occupant of the electric vehicle is located within a predetermined distance of the vehicle.

3. The computing device of claim 1, wherein the electric vehicle is automatically selected for charging due to a match between the MAC address of the electric vehicle and a stored MAC address.

4. The computing device of claim 1, wherein the selecting of the electric vehicle for charging includes detecting an input via a user interface of the computing device that indicates a selection of the electric vehicle from a driver profile.

5. The computing device of claim 1, wherein the computing device determines the current location using global positioning system (GPS) circuitry of the computing device.

6. The computing device of claim 1, wherein the computing device determines the current location using GPS data from a charging station located within a predetermined distance of the computing device.

7. The computing device of claim 1, wherein the computing device determines the current location using triangulation based on two or more wireless communication network access points for which respective locations are known.

* * * * *